United States Patent [19]

Dennison

[11] 4,013,969
[45] Mar. 22, 1977

[54] PROGRAMMABLE DIGITAL PHASE CONTROL APPARATUS

[75] Inventor: Charles M. Dennison, Hiawatha, Iowa

[73] Assignee: Rockwell International Corporation, El Segundo, Calif.

[22] Filed: Mar. 18, 1976

[21] Appl. No.: 668,105

[52] U.S. Cl. ............................ 328/155; 328/48; 328/55; 328/110
[51] Int. Cl.² ........................................ H03B 3/04
[58] Field of Search .......... 307/232, 233 R, 233 B; 328/133, 134, 110, 155, 55, 63, 48

[56] References Cited
UNITED STATES PATENTS

| 3,500,214 | 3/1970 | Broadhead et al. ............ 328/55 X |
| 3,714,589 | 1/1973 | Lewis ............................ 328/155 |
| 3,833,854 | 9/1974 | Schonover ..................... 328/155 |

Primary Examiner—John S. Heyman
Attorney, Agent, or Firm—Bruce C. Lutz; Robert J. Crawford

[57] ABSTRACT

A phase lock loop incorporating a novel feedback arrangement to provide an output of the same frequency as an input reference and phase shifted therefrom by a settable amount. The feedback portion of the phase lock loop from the output of the voltage controlled oscillator to the second input of a phase detector comprises a cycling digital counter and a coincidence detector which detects coincidence between the count of the counter and a set or programmable input. Whenever coincidence occurs, an output signal is provided to the phase detector such that the VCO is adjusted to provide the proper phase relationship between the input and the output signal.

3 Claims, 2 Drawing Figures

PROGRAMMABLE DIGITAL PHASE CONTROL APPARATUS

THE INVENTION

The present invention is directed generally to electronics and more specifically to a device for phase shifting a signal with respect to a reference.

Although there are many analog phase shifters in the prior art and a few digital phase shifters, it is believed that the present invention provides an improvement in both accuracy and simplicity as compared to the prior art.

The present invention uses a phase detector for detecting the difference in phase between a reference input and a feedback signal. The difference in phase is used to actuate a voltage controlled oscillator whose output is counted by a cycling counter which has a digital output. The most significant bit of this counter, after phase lock, will cycle at the same frequency as the reference signal. When a coincidence detector is utilized to compare the output of the counter with a settable input, a feedback signal may be obtained to be applied to the phase detector whenever coincidence occurs. If the counter is a down counter, the phase of the most significant bit used as an output signal will lag the reference, but if the counter is an up counter the phase will lead the reference.

It is, therefore, an object of the present invention to provide an improved programmable phase shifting apparatus.

Other objects and advantages of the invention will be apparent from a reading of the specification and appended claims in conjunction with the drawings wherein:

DETAILED DESCRIPTION

Figure 1:
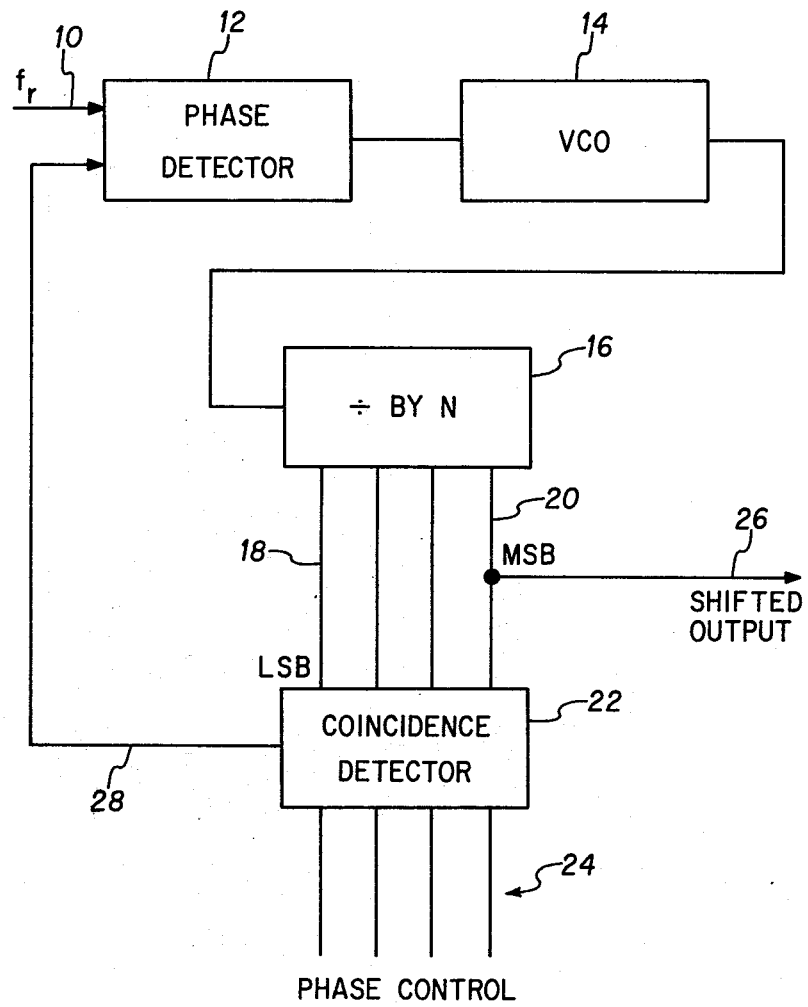
FIG. 1 is a block diagram of the inventive concept.

In FIG. 1, a reference signal $f_r$ of a given frequency is applied on an input lead 10 to a detector 12 whose output is used to control a voltage controlled oscillator 14. The frequency of the voltage controlled oscillator is many (N) times the frequency of the reference signal. The output of the voltage controlled oscillator is applied to a counter 16 which in one embodiment is a down counter. The output of counter 16 provides a parallel digital output on a plurality of leads 18 through 20. As illustrated, the lead 18 is the least significant bit, there are a plurality of unnumbered leads and 20 is the most significant bit (MSB). All of these leads are applied to a coincidence detector 22 which has a phase shift control input comprising a plurality of leads 24 for inputting a predetermined count. As will be noted, the lead 20 containing the MSB is connected to an output terminal 26 for providing a signal which is phase shifted with respect to the signal on lead 10 and is of the same frequency as the signal on lead 10. A feedback output signal is provided on a lead 28 from the coincidence detector to a second input of the phase detector 12.

Figure 2:
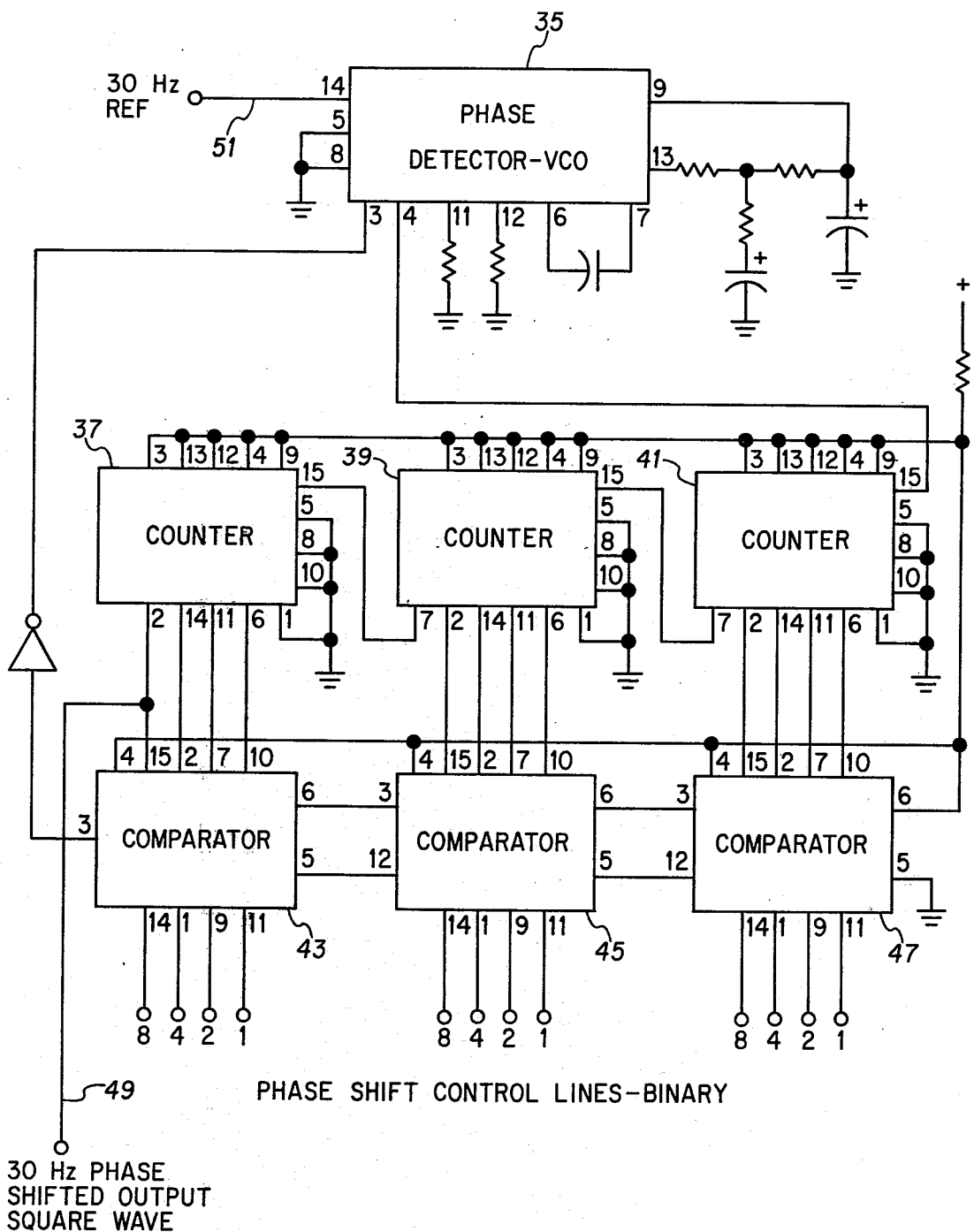
FIG. 2 is a detailed block diagram of the inventive concept showing specific pin connections to obtain the desired results.

In FIG. 2, a circuit is illustrated using similar orientation to that shown in FIG. 1. A first block 35 is a combination phase detector and VCO such as may be purchased from RCA under P/N 4046 in their CMOS Catalog. A plurality of blocks 37, 39 and 41 are counters such as may be purchased from RCA under P/N 4029. These counters perform the same function as is performed by block 16 of FIG. 1.

A plurality of blocks labeled 43, 45 and 47 may be the same as supplied by Motorola under P/N 14585 to provide the coincidence detection function. As will be noted, an output of block 43 is inverted and supplied to an input of the phase detector 35. An output 49 is shown as providing a phase shifted output signal with respect to an input signal supplied on a lead 51 to the phase detector 35. Since all of the pin numbers on the particular purchasable components are illustrated, it is believed that this provides a complete teaching of how to practice the invention.

OPERATION

In operation, the coincidence detector 22 provides a pulse output which may be very short in duration compared to one 360° electrical cycle of the signal supplied on lead 10. The phase detector 12 compares the time occurrence of this pulse with a characteristic such as a positive going transition of the input signal on lead 10. If there is a time difference between the occurrence of these two events, an output of signal is supplied from the phase detector 12 to the voltage controlled oscillator 14 to adjust the frequency of this oscillator. This oscillator will have an output frequency which is approximately in the range of $N \times f_r$. The letter N is referring to the maximum count used by counter 16 in each cycle. The counter 16 in a preferred embodiment has a maximum count of 3600 and counts down from this count to 0 before returning to 3600. The counters 37, 39 and 41 of FIG. 2 as purchased will count to 4,096. However, they are strapped for this invention to a lesser count of 3600. As will be realized, the most significant bit will be raised to a logic 1 at the count of 3600. However, it will be lowered to a logic 0 at the count of 1800. The most significant bit will remain in the logic 0 position until after it passes a digital word count of 0 and returns to the 3600 count. Thus, the output signal on lead 26 is a square wave having a frequency which is 1/3600 the value of the output frequency of the VCO 14. When the feedback signal is connected, this frequency will be the same as the reference frequency 10. The coincidence detector uses control input leads 24 to set a specific count, i.e., 3595 as an input. With this input count, the coincidence detector 22 will note after five cycles of operation of the VCO from the time that counter 16 starts at 3600 that there is coincidence. At this time, an output will be provided on 28 to the phase detector 12. If the positive transition of this pulse occurs at the same time as the positive transition of the input on 10, there will be no adjustment of the VCO. Thus, the output signal on 26 lags the phase of the input signal on 10 by 3595/3600 parts of one cycle or 359.5°. After 3595 complete additional counts, a positive output signal transition will again occur on lead 26. 24 Taking another example, if the input signal on 24 were 1800, the counter 16 would count down to 1800 until the coincidence pulse was provided on 28. If this input control on 24 were provided suddenly as a change from 3595 to 1800, the phase detector would detect a phase difference and adjust the frequency of VCO 14 so as to reduce the time differential of the input pulses to the phase detector to the previous value which in the preferred embodiment was 0. It will be realized that this adjustment in frequency is a temporary or transient condition and once the programmed phase difference is obtained, the frequency of the VCO 14 will again return to its normal value.

As previously indicated, using a down counter for counter 16, the phase of the signal appearing on lead 26 will lag the input. If counter 16 were an up counter, it is at least arguable that this would constitute a phase leading situation. It is realized that the term lead and lag are not always well definable, but the comments are provided to illustrate that the counter 16 does not need to count to it full capacity nor need to count in only one direction. While the output of counter 16 is illustrated as a digital word and the output signal is obtained from the most significant bit, it should also be realized that the output signal may be obtained from other output leads to have a higher frequency than the reference signal and still be phase shifted with respect thereto. Further, other modifications can be made to the actual implementation as illustrated in FIG. 2 and still stay within the scope of the inventive concept. Accordingly, I wish to be limited not by the specific preferred embodiment illustrated, but rather by the scope of the appended claims.

What is claimed is:

1. Phase shifting apparatus comprising in combination:
   phase detector and variable frequency oscillator means including first and second input means and an output means for providing an output signal which changes in frequency in accordance with difference in phase of signals applied to said input means thereof;
   means for supplying a reference frequency signal to said first input means;
   counter means connected to said output means of said oscillator means for providing a repetitive series of digital word outputs of the number of cycles generated;
   variable count detection means, connected between said second input means and to said counter means for providing a signal to said phase detector whenever the count of said counter means coincides with a predeterminable count set in said count detection means; and
   apparatus output means, connected to said counter means, for providing an output signal phase shifted from, but of the said frequency as, the reference frequency.

2. The method of generating a signal of a given frequency, phase shifted with respect to a reference signal of the same frequency comprising, the steps of:
   generating a first signal whose frequency changes as a function of phase difference between a reference frequency signal and a feedback signal;
   generating a cycling digital word output signal indicative of the number of cycles of said first signal wherein the most significant bit of said output signal has the same frequency as, but is phase shifted with respect to, the reference frequency signal; and
   comparing the digital word output signal with a predetermined count for generating a feedback signal upon detection of coincidence.

3. Phase lock loop apparatus for generating a signal of a given frequency wherein the phase of the signal is shifted with respect to the phase of a reference signal of the same frequency comprising, in combination:
   first means for supplying a reference signal having a first phase and a first frequency;
   second means, connected to said first means, for generating a second signal whose frequency is higher than the frequency of said reference signal and whose frequency changes as a function of a phase difference between said reference frequency signal and a feedback signal;
   third means, connected to said second means, for generating a repeating series of digital word output signals which are successively indicative of individual cycles of said second signals wherein the most significant bit of the digital word output signal has the same frequency as, but is phase shiftable with respect to, the reference frequency signal; and
   fourth means, connected to said third means, for comparing the digital word output signal with a predetermined count for generating a feedback signal to be supplied to said second means upon detection of coincidence.

* * * * *